United States Patent [19]

Piasecki

[11] Patent Number: 4,945,262

[45] Date of Patent: Jul. 31, 1990

[54] VOLTAGE LIMITER APPARATUS WITH INHERENT LEVEL SHIFTING EMPLOYING MOSFETS

[75] Inventor: Douglas S. Piasecki, Austin, Tex.

[73] Assignee: Harris Corporation, Melbourne, Fla.

[21] Appl. No.: 301,926

[22] Filed: Jan. 26, 1989

[51] Int. Cl.[5] ................................. H03K 19/003
[52] U.S. Cl. .................................. 307/451; 307/475; 307/594; 307/552; 307/568
[58] Field of Search ........ 307/451, 544, 552, 557–559, 307/568, 443, 448, 542

[56] References Cited

U.S. PATENT DOCUMENTS

| | | | |
|---|---|---|---|
| 3,855,549 | 12/1974 | Huener et al. | 307/451 |
| 3,914,702 | 10/1975 | Gehweiler | 307/451 |
| 4,122,360 | 10/1978 | Kawagai et al. | 307/450 |
| 4,438,352 | 3/1984 | Mardkha | 307/451 |
| 4,563,594 | 1/1986 | Koyama | 307/443 |
| 4,806,786 | 2/1989 | Valentine | 307/448 |

FOREIGN PATENT DOCUMENTS 0141828  11/1980  Japan .................................. 307/451

OTHER PUBLICATIONS

"Improved COS/MOS Inverter Circuit For Reducing Burn-Out and Latch-Up" by Andrew Gordon Francis Dingwall, Technical Notes, A publication of RCA/-Princeton, NJ, Jul. 25, 1979, TN No. 1230.

Primary Examiner—Stanley D. Miller
Assistant Examiner—T. Cunningham
Attorney, Agent, or Firm—Henry I. Schanzer

[57] ABSTRACT

A voltage limiter includes a first FET of a given polarity having the source electrode adapted to be connected to a positive supply terminal. There is a second FET of an opposite polarity to said first and having the source electrode adapted to be connected to a supply terminal which is negative with respect to said positive terminal. The voltage at each terminal may typically vary during operation. There is a voltage clamp means connected between the drain electrodes of said first and second FETs with the gate electrode of the first FET connected to the drain electrode of the second FET and with the gate electrode of the second FET connected to the drain electrode of the first FET, to cause the voltage across said voltage clamping means to remain constant in spite of variations in said positive and negative supplies. The voltage across the drain electrodes of the FETs is further employed as a biasing source for additional logic circuits. An output logic inverter operating with the logic circuits always has its switch point accurately defined with respect to the voltage limiting apparatus. Due to the constant voltage difference provided by the voltage limiter, the propagation delay through the logic circuits is constant with the output inverter having a controlled switching point.

20 Claims, 2 Drawing Sheets

VOLTAGE LIMITER APPARATUS WITH INHERENT LEVEL SHIFTING EMPLOYING MOSFETS

This invention was conceived and was worked on in the course of a Government contract, namely U.S. Army Contract No. DAAA 21-86-C-0030.

BACKGROUND OF THE INVENTION

This invention relates to a voltage limiter apparatus employing MOSFETs and more particularly to a logic circuit employing a voltage limiter with inherent level shifting capabilities.

Voltage limiting is often employed to assure that a voltage at a given terminal remains relatively constant with respect to supply variations. Such voltage limiting circuits are well known and conventional circuits employ Zener diodes, cascaded strings of diodes, as well as other devices, to provide a relatively fixed potential across first and second terminals in spite of a varying power supply.

It is also known that level shifting capability is required in many circuit operations. For example, when interfacing one type of digital IC with another, attention must be given to the logic swing, output drive capability, DC input current, noise immunity, and speed of each device. Hence the prior art is replete with a number of various level shifting circuits for coupling, for example, MOSFETs to other types of logic including TTL and medium powered DTL logic circuits.

In employing such interfaces or level shifting devices, it is important that an output device will switch through the switch point of the succeeding logic stages. In this manner if the switch points are maintained then the circuits, as delay circuits and so on, will exhibit compatible switching and in spite of power supply variations the propagation delay through the logic circuits will remain constant. This will occur, for example, if the reference switching voltage is maintained at a relatively constant level with respect to variations in the positive and negative supply potentials.

It is of course understood that no matter which load and drive characteristics are involved for a digital MOS device, it may be necessary to include some form of level shifting between the devices to provide the necessary driving levels. This is especially true when the device data sheets show a very close tolerance. Thus, it is not practical to have a universal interfacing circuit for MOS devices of different manufacturers. Likewise, it is not even possible to have a universal circuit for interfacing between the MOS device of one manufacturer and all other logic families.

For example, the logic voltage levels, as 0 and 1, the supply voltages, and the temperature ranges vary with MOS manufacturers and with each logic family. For that reason most MOS manufacturers publish interfacing data for their particular product lines. Thus, as one can understand, interfacing even within the same logic families of MOS devices is an extremely difficult task as one must assure that the devices will switch between 0 and 1 for a wide range of input levels. This switching should occur for power supply variations as well.

It is therefore an object of the present invention to provide a voltage limiter which will establish a voltage difference to cause the switch point of a P- and N-MOS device to be optimumly controlled and to track with variations in supply voltages.

It is a further object to employ the above-noted voltage limiter as a source of supply for additional logic circuits to assure that the additional circuits will exhibit reliable switching relatively independent of variations of the main supply voltages and without the need for a separate level shifting device.

BRIEF DESCRIPTION OF THE PREFERRED EMBODIMENT

A voltage limiting apparatus, comprising; a first FET of a given polarity having a source, gate and drain electrode and having said source electrode adapted to be connected to a positive potential supply terminal, which positive potential may vary in level, a second FET of an opposite polarity to said first FET and having a source, gate and drain electrode, with said source electrode of said second FET adapted to be connected to a supply terminal which is negative with respect to said positive potential and which negative potential may vary, and voltage clamp means connected between said drain electrodes of said first and second FETs, with the gate electrode of said first FET connected to the drain electrode of said second FET and with the gate electrode of said second FET connected to the drain electrode of said first FET to cause the voltage across said voltage clamping means to remain relatively constant in spite of variations in said positive and negative potentials in excess of a given clamp voltage.

DETAILED DESCRIPTION OF THE INVENTION

Figure 1:
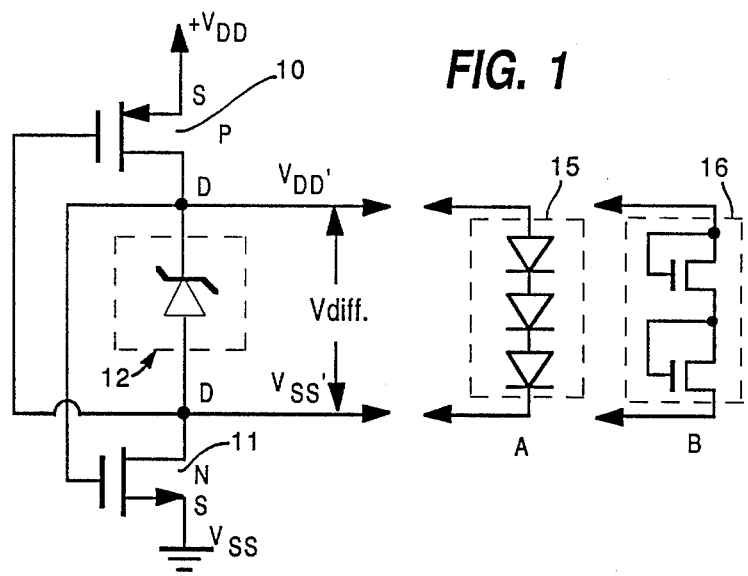
FIG. 1 is a circuit diagram depicting a voltage limiter circuit according to this invention. Diagrams A and B show alternate configurations of typical voltage clamps which can be employed in the circuit of FIG. 1.

Referring to FIG. 1 there is shown a voltage limiter circuit according to this invention. A P-channel FET 10 (P-FET) has its source electrode coupled to a positive source of potential designated as $V_{DD}$. The drain electrode of the P-FET 10 is coupled to one terminal of a voltage clamping device 12. The voltage clamping device 12 is shown enclosed by a dashed line configuration and is a Zener diode. The cathode of the Zener diode is coupled to the drain electrode of the P-FET 10 with the anode of the Zener diode coupled to the drain electrode of an N-channel FET 11 (N-FET). The source electrode of the N-FET 11 is coupled to a point of reference potential or a point of negative potential with respect to $V_{DD}$ designated as $V_{SS}$. The gate electrode of the P-FET is coupled to the drain electrode of the N-FET 11 while the gate electrode of the N-FET 11 is coupled to the drain electrode of the P-FET 10. The P- and N-FETs may be MOSFETs, IGFETs and so on.

In the circuit configuration shown in FIG. 1 both the P-FET 10 and the N-FET 11 are conducting. In this manner the voltage at the drain electrode of the P-FET is designated as $V_{DD}'$ while the voltage at the drain electrode of the N-FET is designated as $V_{SS}'$. $V_{DD}'$ and $V_{SS}'$ differ from $V_{DD}$ and $V_{SS}$ by the source to drain voltage drop across the FETs.

Since a voltage clamp device, such as the Zener diode 12, is connected between the respective drain electrodes, the voltage difference between $V_{DD}'$ and $V_{SS}'$ is relatively constant. This voltage difference will remain constant with both variations in the $V_{DD}$ supply and the $V_{SS}$ supply so long as the voltage is greater than the given voltage. The circuit therefore establishes a voltage difference designated as $V_{diff}$ with $V_{DD}'$ above and $V_{SS}'$ below the switch point of the P- and N-FETs 10 and 11. The P- and N-FETs 10 and 11 exhibit this voltage difference across the drain electrodes as if connected as an inverter. As shown in FIG. 1 (A and B) it is seen that the Zener diode 12 can be replaced by any conventional voltage regulating or clamping device. Thus, as shown in A, the voltage regulator may include a series string of diodes 15 which provide a constant voltage across the terminals, as is well known. As shown in B of FIG. 1, the devices may include a plurality of FETs connected as diodes which serve as a voltage clamping circuit. Thus, the voltage clamp 12 of FIG. 1 can include any of the above-noted devices or other clamping circuits as well.

The circuit is useful in that if the outputs $V_{DD}'$ and $V_{SS}'$ are employed to power other logic circuits then the propagation delay through the logic circuits will be constant with changes in $V_{DD}$ and $V_{SS}$. This will occur since the voltage difference ($V_{diff}$) will remain constant across the terminals $V_{DD}'$ and $V_{SS}'$.

The function of the voltage clamp 12 is to establish a suitable voltage level to develop the necessary $V_{diff}$ and hence the $V_{diff}$ is a function of the magnitude of $V_{DD}$ and $V_{SS}$. As indicated above, the voltage clamp 12 can constitute any well known device, for example as further shown in A and B of FIG. 1.

Figure 3:
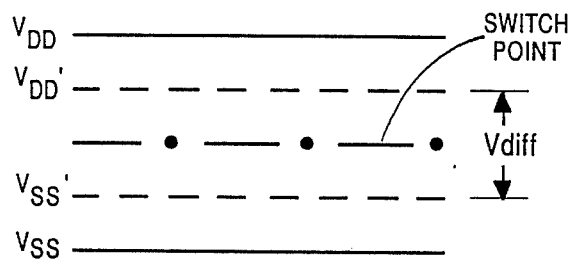
FIG. 3 is a voltage diagram useful in explaining the operation of the circuit of FIG. 1.

Referring to FIG. 3, there is shown a voltage diagram indicative of the operation of the circuit shown in FIG. 1. $V_{DD}$ and $V_{SS}$ are shown by the solid lines. $V_{DD}'$ is above and $V_{SS}'$ is below the switch point of the P-FET 10 and N-FET 11 if they were connected in an inverter configuration, which switch point is shown by the dash-dot line. The difference ($V_{diff}$) between $V_{DD}'$ and $V_{SS}'$ is determined by the voltage clamp device 12 and automatically specifies that the switch point of the P-FET 10 and N-FET 11 will always be between $V_{DD}'$ and $V_{SS}'$ if they were connected to form an inverter. As one can further understand, with $V_{DD}$ and $V_{SS}$ variation the same relationship will always be true and hence the switch point of the P- and the N-FETs 10 and 11 will always be between $V_{DD}'$ and $V_{SS}'$. The voltage difference between $V_{DD}'$ and $V_{SS}'$ is always maintained constant. Thus, with power supply variations the difference between $V_{DD}'$ and $V_{SS}'$ is constant as strictly determined by the voltage clamping device 12.

Figure 2:
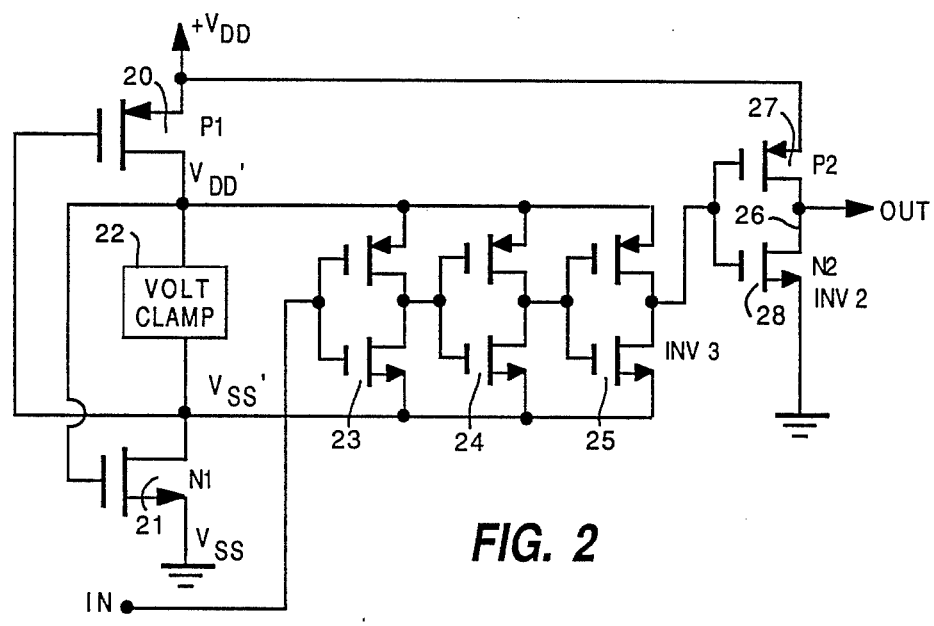
FIG. 2 is a detailed schematic diagram of a typical delay circuit employing logic circuits which are biased from the voltage limiter shown in FIG. 1.

Referring to FIG. 2 there is shown a circuit schematic of a logic delay circuit which employs the voltage limiting device of FIG. 1. As seen in FIG. 2, a P-FET 20 has its source electrode coupled to the $V_{DD}$ supply with its drain electrode coupled to one terminal of a voltage clamp 22. The other terminal of voltage clamp 22 is coupled to the drain electrode of the N-FET 21 having its source electrode coupled to the $V_{SS}$ supply.

The gate electrode of the P-FET 20 is coupled to a drain electrode of the N-FET 21 while the gate electrode of the N-FET 21 is coupled to the drain electrode of the P-FET 20. FETs 20 and 21 are further designated as P1 and N1 and are MOSFETs.

Shown coupled between the drain electrode of the P-FET 20 and the N-FET 21 are additional inverter circuits 23, 24 and 25. Each inverter is a basic complementary inverter receiving a positive operating level from $V_{DD}'$ and a negative operating level from $V_{SS}'$. Each inverter circuit as 23, 24 and 25 consists of a P-FET which conduction path is connected in series with the conduction path of an N-FET with the P- and N-FETs having their gate electrodes connected together. The output of each inverter is taken between the drain connection of the P- and N-FETs and is applied to a next inverter. For example, inverter 23 has its output connected to the input of inverter 24 while inverter 24 has its output connected to the input of inverter 25. The output of inverter 25 is coupled to the connected gate electrode input of an additional output inverter consisting of a P-FET 27 in series with an N-FET 28. The P-FET 27 and the N-FET 28 are arranged in an inverter configuration and receive operating potential from $V_{DD}$ and $V_{SS}$ as the source electrode of the P-FET 27 is connected to $V_{DD}$ while the source electrode of the N-FET 28 is connected to $V_{SS}$.

The inverters 23, 24 and 25 receive operating potential between $V_{DD}'$ and $V_{SS}'$ which as indicated is a clamped source and hence the voltage difference between $V_{DD}'$ and $V_{SS}'$ is constant so long as the difference between $V_{DD}'$ and $V_{SS}'$ exceeds the clamp (zener) voltage. Thus, as described above, with any variations in $V_{DD}$ and $V_{SS}$ the inverters 23, 24, and 25 will be biased between a constant potential and hence the propagation delay of these inverters will be constant.

The output inverter, which consists of the P-FET 27 and the N-FET 28, is biased between $V_{DD}$ and $V_{SS}$. The output inverter, including P- and N-FETs 27 and 28, will always switch within predetermined limits. In this manner, in spite of any supply variations, the output inverter will always have a controlled switching point. Furthermore, the propagation delay of an input signal applied to the gate electrodes of inverter 23 will provide an output signal (OUT) at the output inverter where the output signal will have a constant propagation delay with respect to the input signal and will switch between 0 and 1 according to the input signal. The delay through the throughput inverter varies as a function of the operating potential. In FIG. 2 the circuit includes four inverters and the overall variation is significantly reduced.

The circuit as shown in FIG. 2 possesses the additional advantage that inherent level shifting is incorporated due to the voltage limiter configuration used to drive the inverters 23, 24 and 25. Since $V_{DD}'$ and $V_{SS}'$ will settle above and below, respectively, the switch point of the P- and N-FETs 20 and 21 the circuit with power connected to $V_{DD}'$ and $V_{SS}'$ will have an output which switches through the switch points of the P- and N-FETs 20 and 21. If the FETs 27 and 28 have the same effective ratio of P to N as in the voltage limiter circuit FETs 20 and 21, then its switch point will be the same as that of the P- and N-FETs 20 and 21 if they were connected as inverters. Thus the P- and N-FETs in each circuit are of the same geometrical size having the same size drain, gate and source areas.

Thus the ratio of P1 to N1 should equal the ratio of P2 to N2. The inverter consisting of FETs 27 and 28 has the same ratio of P to N as FETs 20 and 21. The logic circuits as connected to $V_{DD}'$ and $V_{SS}'$ are used to drive the output inverter which is connected between $V_{DD}$ and $V_{SS}$. However, no special level shifter is required to drive the output inverter circuit because the output swing of the inverter 25 driving the output inverter will always pass through the switch point of the output inverter.

It is noted that other clamping circuits usually clamp from a fixed voltage source, say $V_{DD}$ or $V_{SS}$ up to the clamp level and they do not change where this circuit will cause the voltage difference $V_{diff}$ to follow about the switch point of the P- and N-FETs as 20 and 21. Thus, the circuit eliminates the need for a special level shifter.

Figure 4:
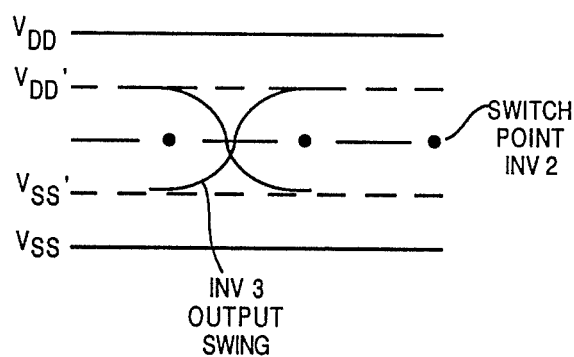
FIG. 4 is a voltage diagram useful in explaining the operation of the circuit of FIG. 2.

Referring to FIG. 4 there is shown the voltage diagram indicative of the circuit operation of FIG. 2. Again in FIG. 4 the $V_{DD}$ and $V_{SS}$ supplies are shown by solid lines. The $V_{DD}'$ and $V_{SS}'$ levels are indicated by dashed lines. One curve indicates the possible conditions of the inverter 25 (INV. 3) output swing while the other curve indicates the switch point of the output inverter designated INV. 2. The output inverter of P-FET 27 and N-FET 28 will always have a switching point between $V_{DD}'$ and $V_{SS}'$ as does the input voltage limiter comprising transistors 20 and 21. In this manner, the additional logic circuits, as 23, 24 and 25, when driven by the voltage limiter of P- and N-FETs 20 and N-channel 21 will always operate so that the output inverter employing transistors 27 and 28 will always switch in spite of any variations in the $V_{DD}$ and $V_{SS}$ supplies.

Thus, as indicted above, this circuit configuration will enable the utilization of different MOS devices, as for example supplied by different manufacturers, to operate accordingly. Hence one can use any typical logic circuit, for 23, 24 and 25, from various manufacturers and to assure optimum switching operation of the output inverter as above described.

The inverters 23, 24 and 25 are shown as basic MOS complementary inverters as is the output inverter. The operation of such inverters are well known. Practically all MOS devices used in digital circuits employ some form of complementary inverter. The basic circuit is shown in FIG. 2 as for the output inverter with FETs 27 and 28. The complementary inverter uses both the P-channel and N-channel sections of a common substrate or chip. In the circuit the P-channel source is connected to the supply. voltage $V_{DD}$ with the N-channel source connected to $V_{SS}$ or to ground. The gate electrodes of both devices are connected together and represent the input. The output is taken from both drains as indicated which are also coupled together.

Logic levels for the inverter are a positive voltage for a 1 and a ground or a negative voltage for a 0. With a true positive input designated as for example $V_{DD}$ the P-channel FET 27 of the substrate has a 0 gate voltage and is essentially cut off. The P-channel FET 27 conducts very little drain current which is typically a few picoamperes of leakage current as for example for an enhancement MOSFET. The N-channel FET 28 of the chip is forward biased and its drain voltage, with only a few picoamperes of leakage drain current allowed to flow, is near ground or false (0). With a zero, or ground input, the N-FET 28 is cut off and permits only a small amount of leakage drain current to flow. The P-FET is then forward biased placing the P-channel drain at some voltage near $V_{DD}$ as $V_{DD}'$.

As one can ascertain, no matter which logic signal is applied at the input a well defined logic level appears at the output and the power output logic level is well determined and power dissipation will be low. This is because both stable states which are the 1 or 0 are conducting only a few picoamperes of leakage current since both channels are effectively in series. Power is dissipated only during switching which of course is an ideal situation for logic circuits.

In addition to the lower power dissipation, another advantage of MOS devices for digital logic circuits is that no coupling elements are required as the gate acts as a coupling capacitor. Since no capacitors are needed, it is relatively simple to fabricate MOSFET logic circuits in IC form as for example gates, inverters and so on with either positive or negative logic. While the circuits 23, 24 and 25 of FIG. 2 are inverters, it is of course understood that they can consist of any other type of logic circuits, such as OR, NOR, AND and NAND gates. As one can ascertain, apart from being MOS devices, the inverter circuits can also be TTL devices or any other type of logic devices which are biased between $V_{DD}'$ and $V_{SS}'$ with the output device consisting of the P- and an N-channel FETs 27 and 28 arranged in a basic complementary inverter configuration and operated between the same supply voltages as is the voltage limiter consisting of P-FET 20 and N-FET 21.

Thus, in view of the above, one skilled in the art may consider many alternate circuit configurations which are deemed to be encompassed within the spirit and scope of the claims as appended hereto.

What is claimed is

1. A voltage limiting apparatus, comprising:
   first and second power terminals for the application therebetween of an operating potential which may vary in amplitude;
   a first field-effect transistor (FET) of a given conductivity type having a source, gate and drain electrode, and means for connecting said source electrode to said first power terminal;
   a second FET of an opposite conductivity type to said first FET and having a source, gate and drain electrode, and means connecting said source electrode of said second FET to said second power terminal and
   voltage clamping means connected between said drain electrodes of said first and second FETs, with the gate electrode of said first FET connected to the drain electrode of said second FET and with the gate electrode of said second FET connected to the drain electrode of said first FET to cause the voltage across said voltage clamping means to remain relatively constant notwithstanding variations in said operating potential.

2. The voltage limiting apparatus according to claim 1 wherein said FETs are metal oxide semiconductor field effect transistors (MOSFETs).

3. The voltage limiting apparatus according to claim 1 wherein said first FET is a p-channel FET and said second FET is an N-channel FET.

4. The voltage limiting apparatus according to claim 2 wherein said first and second FETs are MOSFETs with said first FET being a P-MOSFET and said second FET being an N-MOSFET.

5. The voltage limiting apparatus according to claim 1 wherein said voltage clamp means is a Zener diode, having an anode connected to the drain electrode of said second FET and a cathode connected to the drain electrode of said first FET.

6. The voltage limiting apparatus according to claim 1 wherein said voltage clamping means is a series diode string having the anode of a first diode in said string connected to the drain electrode of said first FET and the cathode of a last diode in said string connected to the drain electrode of said second FET.

7. The voltage limiting apparatus according to claim 1 wherein said voltage clamping means is a series string of FETs each in a diode configuration having the source or drain electrode connected to the gate electrode and connected between the drain electrodes of said first and second FETs.

8. The voltage limiting apparatus according to claim 1 further including:
at least one logic device means having an input and an output terminal and operative to receive a source of bias between positive and negative power bias terminals, with the positive power bias terminal of said logic device connected to the drain electrode of said first FET and with the negative power bias terminal of said logic device connected to the drain electrode of said second FET, with means for supplying a logic signal to said input terminal for producing a processed logic signal at said output terminal;

9. The voltage limiting apparatus according to claim 8 wherein said logic device means includes a plurality of cascaded FET complementary inverters, each inverter comprising a P-FET and an N-FET with the gate electrodes of the P-FET and N-FET being connected together and forming the input of the inverter, the drains of the P-FET and N-FET being connected together and forming the output of the inverter, the source of the P-FET being connected to said positive power bias terminal, and the source of said N-FET being connected to said negative power bias terminal, with a first inverter in the plurality of cascaded inverters receiving said input logic signal at its input and with a last inverter in the plurality of cascaded inverters having its output connected to the input of said output complementary inverter.

10. The voltage limiting apparatus according to claim 8 wherein said output complementary inverter is a MOSFET inverter having a P-FET in series with an N-FET with the source electrode of said first FET connected to said source electrode of said first FET and with the source electrode of said N-FET connected to the source electrode of said second FET, with the gate electrodes of said P-FET and said N-FET connected together for forming the input terminal of said output complementary inverter and with the connected drain electrodes of said P-FET and said N-FET connected together as said output terminal.

11. The voltage limiting apparatus according to claim 10 wherein said logic device means includes a plurality of cascaded complementary MOS inverters, with each complementary M inverter including a P-FET in series with an N-FET with each one of said P-FET and N-FET forming each complementary MOS invertor having a gate electrode, a source electrode and a drain electrode, with the P-FET and N-FET forming each complimentary MOS inverter having their gates connected together to provide an input to the inverter and having their drains connected together to provide an output from the invertor, with the source electrodes of each P-FET in each complementary MOS invertor being coupled to the drain electrode of said first FET and with the source electrodes of each N-FET in each complementary MOS invertor being coupled to the drain electrode of said second FET, with the gate electrodes of a first cascaded inverter connected to receive said logic signal and with the drain electrodes of a last cascaded inverter connected to the input of said output complementary inverter.

12. The voltage limiting apparatus according to claim 10 wherein the ratio of the geometries of said P-FET to said N-FET in said output inverter is the same as the ratio of the geometries of said first FET to said second FET.

13. The voltage limiting apparatus according to claim 10 wherein said first FET is a P-MOSFET and said second FET is an N-MOSFET with the ratio of the geometries of said first FET and to said second FET being the same ratio as that of the geometries of said P-FET in said output inverter to said N-FET in said output inverter.

14. A logic circuit including a voltage limiting apparatus employing an inherent level shifting operation, comprising:
a voltage limiting stage, including a first P-channel FET having a source, drain and gate electrode, with means connecting said source electrode to a first power supply terminal for receiving a positive potential which may vary in level, a first N-channel FET having a source, drain and gate electrode, with means connecting said source electrode to a second power supply terminal for receiving a negative potential with respect to said positive potential, a voltage clamp means connected between the drain electrodes of said first P-channel and first N-channel FETs, with the gate electrode of said first P-channel FET connected to the drain electrode of said first N-channel FET and with said gate electrode of said first N-channel FET connected to the drain electrode of said first P-channel FET, and operative to provide a constant difference potential between said drain electrodes and across said voltage clamp means;
logic device means having an input terminal for receiving a digital logic signal, and an output terminal for providing a processed signal, said logic device means operative to receive a positive and negative operating potential by connecting a positive power terminal to said drain electrode of said first P-channel FET and by connecting a negative power terminal to said drain electrode of said first N-channel FET whereby said logic device means is operated at said constant difference potential, to thereby assure a constant propagation delay through said logic device means independent of variations in the level of said positive and negative potentials;
an output inverter comprising a second P-channel FET in series with a second N-channel FET, with the source electrode of said second P-channel FET connected to the source electrode of said first P-channel FET and with the source electrode of said second N-channel FET connected to the source electrode of said first N-channel FET, with the drain electrodes of said second P-channel and N-channel FETs connected together to an output terminal and with the gate electrodes of said second P-channel and N-channel FETs connected together and to the output terminal of said logic device means, wherein said output inverter will always switch upon receipt of a suitable processed logic signal independent of any variation in said positive and negative potentials.

15. The apparatus according to claim 14 wherein the ratio of the geometries of said first P-channel FET to said first N-channel FET ($P_1/N_1$) is the same as the ratio of the geometries of said second P-channel FET to said second N-channel FET ($P_2/N_2$) where $P_1/N_1 = P_2/N_2$.

16. The apparatus according to claim 14 wherein said voltage clamp means is a Zener diode having the cathode to anode path connected between the drain electrodes of said first P-channel FET and said first N-channel FET.

17. The apparatus according to claim 14 wherein said voltage clamp means is a series diode string having the anode to cathode path of said string connected between the drain electrodes of said first P-channel FET and said first N-channel FET.

18. The apparatus according to claim 14 wherein said voltage clamp means is a series string of FET devices, each device arranged in a diode configuration, having the source to drain path of said FET diode configurations connected between the drain electrodes of said first P-channel FET and said first N-channel FET.

19. The apparatus according to claim 14 wherein all said P-channels FETs and N-channel FETs are MOSFETs arranged on a common substrate.

20. A logic circuit including a voltage limiting apparatus employing an inherent level shifting operation, the combination comprising:

first and second power terminals for the application therebetween of an operating potential which may vary in amplitude;

first and second voltage terminals for the production therebetween of a relatively constant voltage of lower amplitude than that of said operating potential;

first and second insulated gate field effect transistors (IGFETs) of first and second conductivity type respectively, each IGFET having a source, a drain, and a gate electrode;

means connecting the source of said first IGFET to said first power terminal;

means connecting the source of said second IGFET to said second power terminal;

means connecting the drain of said first IGFET and the gate of said second IGFET to said first voltage terminal;

means connecting the drain of said second IGFET and the gate of said first IGFET to said second voltage terminal; and voltage clamp means connected between said first and second voltage terminals for maintaining the voltage between said first and second voltage terminals relatively constant in spite of variations in the amplitude of the operating potential applied between said first and second power terminals.

* * * * *